United States Patent
Choi et al.

(10) Patent No.: US 7,408,826 B2
(45) Date of Patent: Aug. 5, 2008

(54) SEMICONDUCTOR MEMORY DEVICE

(75) Inventors: Jong-Hyun Choi, Suwon-si (KR);
Dong-Il Seo, Yongin-si (KR); Nam-Jong Kim, Yongin-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 39 days.

(21) Appl. No.: 11/489,440

(22) Filed: Jul. 20, 2006

(65) Prior Publication Data

US 2007/0047357 A1 Mar. 1, 2007

(30) Foreign Application Priority Data

Aug. 18, 2005 (KR) .................. 10-2005-0075915

(51) Int. Cl.
*G11C 7/00* (2006.01)
(52) U.S. Cl. .................. 365/205; 365/203; 365/104; 365/196
(58) Field of Classification Search .................. 365/205, 365/104
See application file for complete search history.

(56) References Cited

U.S. PATENT DOCUMENTS

| | | | | |
|---|---|---|---|---|
| 6,009,024 A | * | 12/1999 | Hirata et al. | 365/190 |
| 6,385,159 B2 | * | 5/2002 | Hidaka et al. | 365/189.09 |
| 2003/0193824 A1 | * | 10/2003 | Tsukikawa et al. | 365/149 |
| 2005/0017240 A1 | | 1/2005 | Fazan | 257/59 |
| 2006/0227595 A1 | * | 10/2006 | Chuang et al. | 365/154 |
| 2006/0270159 A1 | * | 11/2006 | Weis | 438/266 |

FOREIGN PATENT DOCUMENTS

| | | |
|---|---|---|
| KR | 10-2000-0044652 | 7/2000 |
| KR | 10-2005-0027781 | 3/2005 |

* cited by examiner

*Primary Examiner*—Thong Q Le
(74) *Attorney, Agent, or Firm*—Harness, Dickey & Pierce P.L.C.

(57) ABSTRACT

A semiconductor memory device that includes a memory cell array having a plurality of memory cells that are connected between a bit line pair, which transfers data to the bit line pair, a precharge circuit for precharging the bit line pair to a precharge voltage level during a precharge period, and one or more bit line sense amplifiers which are connected between the bit line pair and detect a voltage difference of the bit line pair to amplify a level of the bit line pair. The semiconductor memory device includes one or more FINFETs.

19 Claims, 4 Drawing Sheets

SEMICONDUCTOR MEMORY DEVICE

PRIORITY STATEMENT

This application claims the benefit of priority to Korean Patent Application No. 2005-75915, filed Aug. 18, 2005, the entire contents of which are incorporated herein by reference.

BACKGROUND OF THE INVENTION

1. Field of the Invention

The present invention relates to a semiconductor memory device and, more particularly, to a semiconductor memory device including FINFETs.

2. Description of the Related Art

Because a semiconductor memory device is becoming widely used as a memory device for a portable terminal device, for example, a cellular phone, a PDA, a digital camera, etc., the demand for miniaturization of the semiconductor memory device is increased. To this end, a semiconductor memory device should be designed to reduce a layout area size of a core region of the semiconductor device so more circuit elements can be arranged on the semiconductor device and/or the overall size of the semiconductor device may be reduced.

FIG. 1 is a circuit diagram illustrating a core region of a conventional semiconductor memory device.

Referring to FIG. 1, a core region of a conventional semiconductor device may include a memory cell array 1, a precharge circuit 21, a bit line sense amplifier 22 and a data I/O circuit 23. The memory cell array 1 may read and/or write data in response to a signal transmitted via a word line WL and a bit line pair BL and /BL. The precharge circuit 21 may precharge the bit line pair BL and /BL to a precharge voltage level in response to a precharge control signal PEQ. The bit line sense amplifier 22 may detect and/or amplify a voltage difference of the bit line pair BL and /BL in response to a sensing control signal pair LA and /LA, and the data I/O circuit 23 may transmit data of the bit line pair BL and /BL to a local data I/O line pair LIO and /LIO or may transmit data of the local data I/O line pair LIO and /LIO to the bit line pair BL and /BL in response to a column selecting signal CSL.

The components of FIG. 1 are explained below.

The memory cell array 1 may include a plurality of memory cells MC, each of which includes at least one n-type Metal Oxide Semiconductor Field Effect Transistor (n-MOSFET) (not shown) or p-type Metal Oxide Semiconductor Field Effect Transistor (p-MOSFET) (not shown) and a capacitor (not shown) which may be connected between the word line WL and the bit line pair BL and /BL.

The precharge circuit 21 may include first and second n-MOSFETs NM1 and NM2, which may be connected directly between the bit line pair BL and /BL, may have a gate to which a precharge control signal PEQ may be applied, and may precharge the bit line pair BL and /BL to a precharge voltage VCC/2 level in response to the precharge control signal PEQ. The precharge circuit 21 may also include a third n-MOSFET NM3, which may be connected between the bit line pair BL and /BL, may have a gate to which the precharge control signal PEQ may be applied, and may precharge the bit line pair BL and /BL to the precharge voltage VCC/2 level in response to the precharge control signal PEQ.

The bit line sense amplifier 22 may include a p-type sense amplifier and an n-type sense amplifier that may be connected to the bit line pair BL and /BL, respectively. The p-type sense amplifier may be serially connected between the bit line pair BL and /BL; may include first and second p-MOSFETs PM1 and PM2, which may have a gate connected to the bit line pair BL and /BL and a common source to which a sensing control signal LA may be applied; and may detect data of a low level of one of the bit line pair BL and /BL to amplify the other line of the bit line pair BL and /BL to a power voltage VCC level. The n-type sense amplifier may be serially connected between the bit line pair BL and /BL; may include fourth and fifth n-MOSFETs NM4 and NM5, which may have a gate connected to the bit line pair BL and/or /BL and a common source to which an inverted sensing control signal /LA may be applied; and may detect data of a high level of one of the bit line pair BL and /BL to amplify the other line of the bit line pair BL and /BL to a ground voltage level, for example, 0 Volts.

The data I/O circuit 23 may include a sixth n-MOSFET NM6, which may be connected between the bit line BL and the local data I/O line LIO and may have a gate to which the column selecting signal CSL may be applied, and a seventh n-MOSFET NM7, which may be connected between an inverted bit line /BL and an inverted local data I/O line /LIO and may have a gate to which the column selecting signal may be applied; and may electrically connect the bit line pair BL and /BL and the local data I/O line pair LIO in response to the column selecting signal CSL.

An operation of the conventional semiconductor memory device of FIG. 1 is explained below with reference to FIG. 2.

For illustrative purposes, assume that data having a value of "0" is stored in a 0-th memory cell MC0 of the memory cell array 1 and the conventional semiconductor memory device in FIG. 1 reads data in the 0-th memory cell MC0 by a reading operation.

At a time T0 in FIG. 2, the conventional semiconductor memory device may be in a precharge state, word lines WL0 to WLN may have a low level, and a bit line precharge control signal PEQ may have a high level. The n-MOSFETs NM1 to NM3 of the precharge circuit 21 may be activated to precharge the bit line pair BL and /BL to a precharge voltage VCC/2.

At a time T1, the bit line precharge control signal PEQ may transition from a high level to a low level and the 0-th word line WL0 may transition from a low level to a high level so that the 0-th memory cell MC0 may be selected and data of the 0-th memory cell MC0 may be outputted to the bit line pair BL and /BL. As a result, a voltage of the bit line BL may gradually drop and the inverted bit line /BL may maintain the precharge voltage VCC/2 level.

At a time T2, a voltage of a sensing control signal LA may change from the precharge voltage VCC/2 to a power voltage VCC and a voltage of an inverted sensing control signal /LA may change from the precharge voltage VCC/2 to a ground voltage, for example, 0 Volts so that the power voltage VCC may be applied to the sources of the first and second p-MOSFETs PM1 and PM2 of the bit line sense amplifier 22, and the ground voltage, for example, 0 Volts may be applied to drains of the fourth and fifth n-MOSFETs NM4 and NM5.

At a time T3, if a voltage difference between the sensing control signal LA and the bit line BL is greater than a threshold voltage VTm of the MOSFET, the second p-MOSFET PM2 of the bit line sense amplifier 22 may be activated to apply the power voltage VCC to the inverted bit line /BL so that a voltage of the inverted bit line /BL may be increased. If a voltage difference between the inverted sensing control signal /LA and the inverted bit line /BL is greater than the threshold voltage VTm of the MOSFET, the fourth n-MOSFET NM4 may be activated to drop a voltage of the bit line to the ground voltage, for example, 0 Volts.

Accordingly, if the voltage difference between the sensing control signal LA and the bit line BL or the voltage difference between the inverted sensing control signal /LA and the inverted bit line /BL is greater than the threshold voltage VTm of the MOSFET, the bit line sense amplifier 22 may be activated and start an operation for amplifying the bit line pair BL and /BL.

At a time T4, if an amplification operation of the bit line pair BL is stabilized, the column selecting signal CSL may transition from a low level to a high level and data of the bit line pair BL may be transmitted to the local data I/O line pair LIO and /LIO so that data of the memory cell MC0 may be read.

At a time T5, if the read operation is completed, the 0-th word line WL0 may transition from a high level to a low level again to keep data of the 0-th memory cell MC0 in a storing state.

At a time T6, for the next read or write operation, the bit line precharge control signal PEQ may transition from a low level to a high level again to precharge the bit line pair BL and /BL to the precharge voltage VCC/2, whereby the semiconductor memory device becomes the precharge state again.

A write operation of the semiconductor memory device is performed based on the same principles as described with respect to the read operation described in FIG. 2, and thus, a description of the write operation will be omitted for the sake of brevity.

As described above, in a conventional semiconductor memory device, a MOSFET is used to form the memory cell MC, the precharge circuit 21, the bit line sense amplifier 22, and/or the data I/O circuit 23 and may be activated or deactivated to read or write data of the memory cell in response to a plurality of control signals PEQ, LA, /LA, and CSL and a voltage level of the bit line pair BL and /BL.

The MOSFET of FIG. 1 is a planar type transistor, and when the MOSFET is an n-MOSFET, as shown in FIG. 3, the MOSFET includes an n-type drain and an n-type source formed to be separated from each other and a gate electrode formed on a p-type substrate between the n-type drain and the n-type source.

The n-MOSFET may apply a voltage of more than the threshold voltage VTm to a gate to sufficiently induce electrons on a surface of the gate to form a channel so that an electric current may flow between the source and the drain through a channel. The conventional n-MOSFET has the threshold voltage VTm of about 0.7 Volts.

Even though not shown, similar to the n-MOSFET of FIG. 3, the p-MOSFET includes a p-type drain and a p-type source formed to be separated from each other and a gate electrode formed on an n-type substrate between the p-type drain and the p-type source and has the threshold voltage VTm of about 0.7 Volts.

Moreover, the second p-MOSFET PM2 of the bit line sense amplifier 22 may be activated to start the sensing operation if a voltage difference between the sensing control signal LA and the bit line BL is greater than about 0.7 Volts and the voltage difference VGS between the gate and the source of the second p-MOSFET PM2 is greater than about 0.7 Volts as shown at the time T3 of FIG. 2.

As described above, in a conventional semiconductor memory device the transistors are horizontally formed on the substrate as shown in FIG. 3 and occupy a relatively wide area and thus, the transistors cannot be formed in a smaller area without detrimental affects.

For example, conventionally, if an area on which the transistor is formed is reduced to reduce the size of the semiconductor memory device; the length of the gate of the MOSFET is reduced, which may cause several problems. For example, the source and the drain of the MOSFET may be too closed to each other. In this case, the impurity doping density should be increased, and the channel area is affected by interaction between the source and the drain. As a result, a characteristic of the transistor as an active switching element, which controls an operation of the transistor by adjusting a gate voltage of the MOSFET, may be degraded so that electrical characteristics of the MOSFET, for example, a stable threshold voltage, may be degraded.

As described above, there are limitations to reducing the layout area size of a core region of the conventional semiconductor memory device, and even though the layout area size of the core region may be reduced by reducing the gate length, e.g., the channel area between the source and the drain of a plurality of transistors, operation characteristics of the semiconductor memory device may be degraded.

SUMMARY OF THE INVENTION

An example embodiment of the present invention provides a semiconductor memory device in which circuits in the core region of the semiconductor memory device are implemented using FINFETs, which may reduce the size of the semiconductor memory device and/or increase the operating speed of the semiconductor memory device.

An example embodiment of the present invention provides a semiconductor memory device. The semiconductor memory device may include a memory cell array and at least one bit line sense amplifier. The memory cell array includes a plurality of memory cells connected between a bit line pair and transfers data to the bit line pair. The at least one bit line sense amplifier is connected between the bit line pair and detects a voltage difference of the bit line pair to amplify a level of the bit line pair. The at least one bit line amplifier includes transistors which have a smaller layout area size and a lower threshold voltage than a MOSFET.

According to an example embodiment of the present invention, a bit line sense amplifier may include a p-type sense amplifier having a first p-FINET and a second p-FINFET which are connected in series between the bit line pair and detect a low level of one of the bit line pair to amplify the other line of the bit line pair to a first voltage level; and an n-type sense amplifier having first n-FINFET and a second n-FINFET which are serially connected in series between the bit line pair and detects a high level of one of the bit line pair to amplify the other line of the bit line pair to a second voltage level.

An example embodiment of the present invention provides a semiconductor memory device. The semiconductor memory device may include a memory cell array, a precharging circuit, and at least one bit line sense amplifier. The memory cell array may include a plurality of memory cells which are connected between a bit line pair and may transfer data to the bit line pair. The precharge circuit may precharge the bit line pair to a precharge voltage level during a precharge period. The at least one bit line sense amplifier may be connected between the bit line pair and may detect a voltage difference of the bit line pair to amplify a level of the bit line pair. The at least one bit line sense amplifier includes at least one FINFET.

A precharge circuit according to an example embodiment of the present invention may include first and second FINFETs which are connected between the bit line pair and precharge the bit line pair in response to a precharge control signal; and a third FINFET which is connected between the bit line pair and causes voltage levels of the bit line pair to match in response to the precharge control signal.

A bit line sense amplifier according to an example embodiment of the present invention may include a p-type sense amplifier having a first p-FINET and a second p-FINFET which are connected in series between the bit line pair and detects a low level of one of the bit line pair to amplify the other line of the bit line pair to a first voltage level; and a n-type sense amplifier having a first n-FINET and a second n-FINFET which are connected in series between the bit line pair and detects a high level of one of the bit line pair to amplify the other line of the bit line pair to a second voltage level.

BRIEF DESCRIPTION OF THE DRAWINGS

The above and other features and advantages of the present invention will become more apparent to those of ordinary skill in the art by the following description of example embodiments of the present invention taken in conjunction with the accompanying drawings, in which.

DETAILED DESCRIPTION OF EXAMPLE EMBODIMENTS OF THE PRESENT INVENTION

Figure 1:
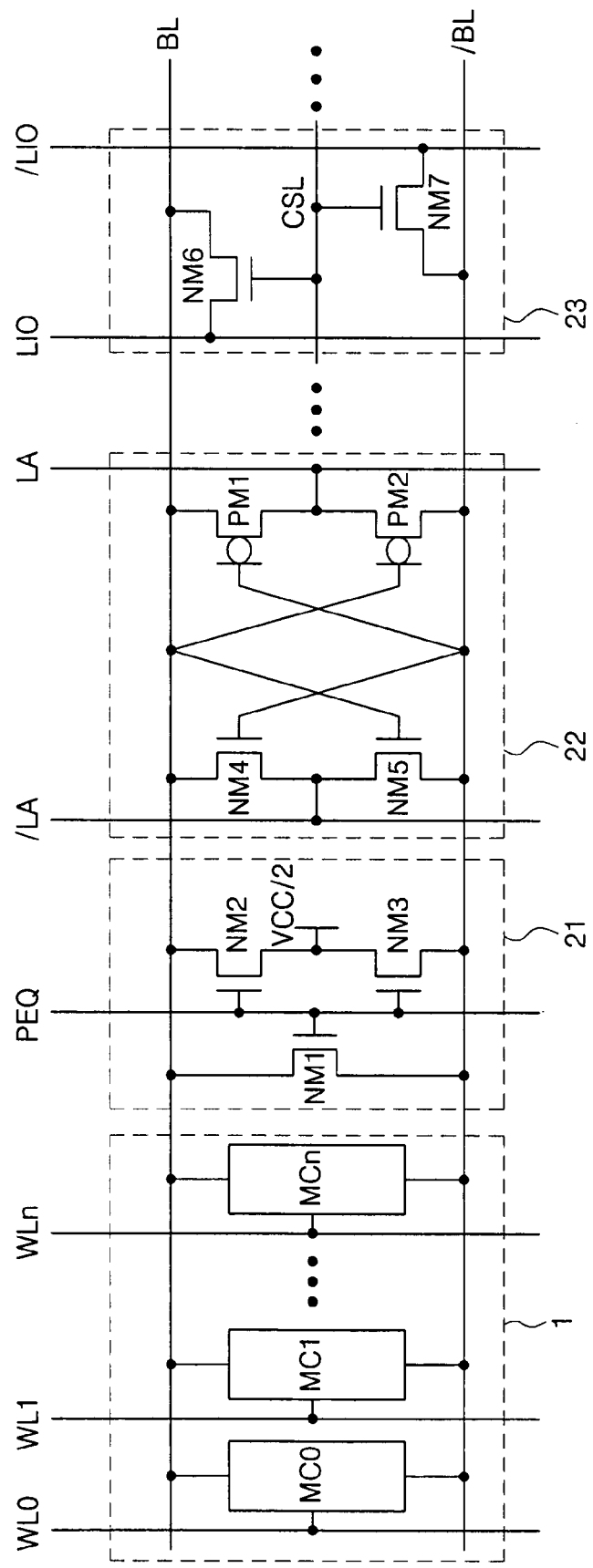
FIG. 1 is a circuit diagram illustrating a core region of a conventional semiconductor memory device.
Figure 2:
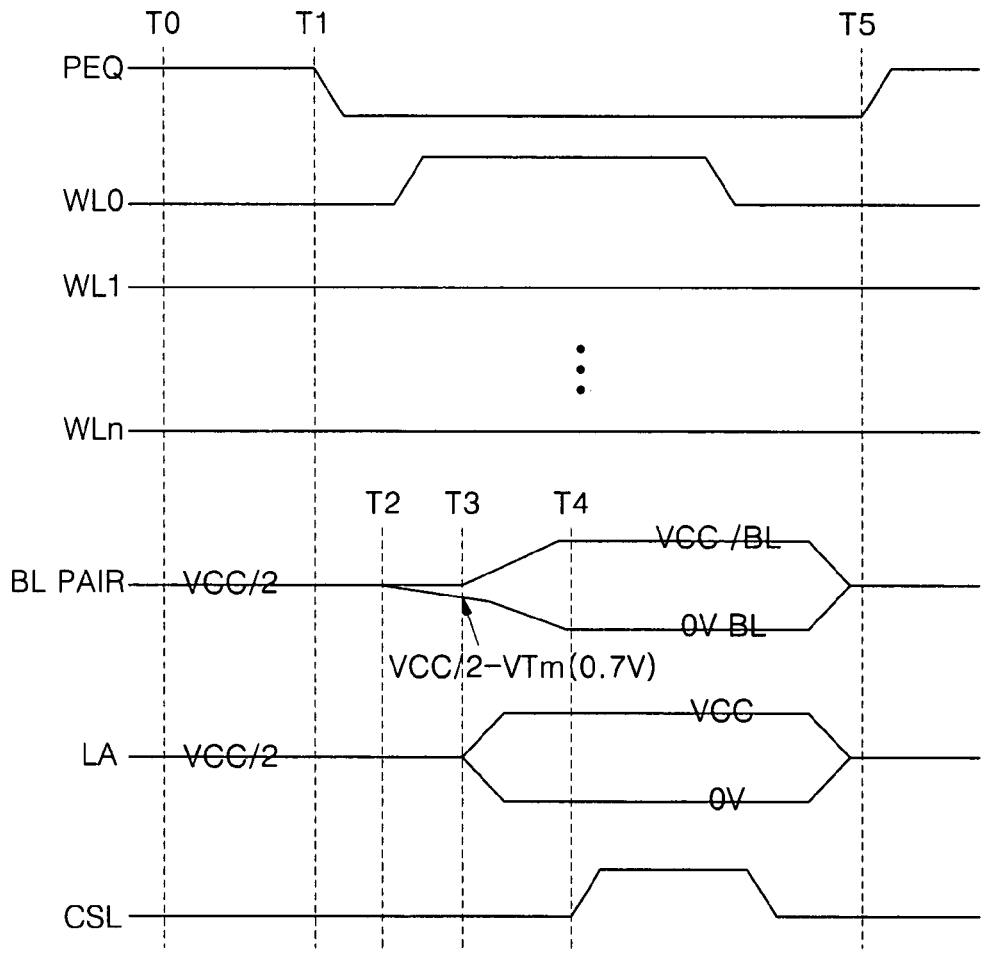
FIG. 2 is a timing diagram illustrating an operation of the conventional semiconductor memory device of FIG. 1.

Detailed illustrative embodiments of the present invention are disclosed herein. However, specific structural and functional details disclosed herein are merely representative for purposes of describing example embodiments of the present invention. This invention may, however, may be embodied in many alternate forms and should not be construed as limited to only the embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the invention to the particular forms disclosed, but on the contrary, example embodiments of the invention are to cover all modifications, equivalents, and alternatives falling within the scope of the invention.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The terminology used herein is for the purpose of describing particular embodiments only and is not intended to be limiting of example embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Example embodiments of the present invention will now be described more fully hereinafter with reference to the accompanying drawings, in which example embodiments of the present invention are shown. This invention may, however, be embodied in different forms and should not be construed as limited to the embodiments set forth herein. Rather, these example embodiments are provided so that this disclosure will be thorough and complete, and will fully convey the scope of the invention to those skilled in the art. In the drawings, the thickness of layers and regions are exaggerated for clarity. Like numbers refer to like elements throughout the specification.

Figure 4:
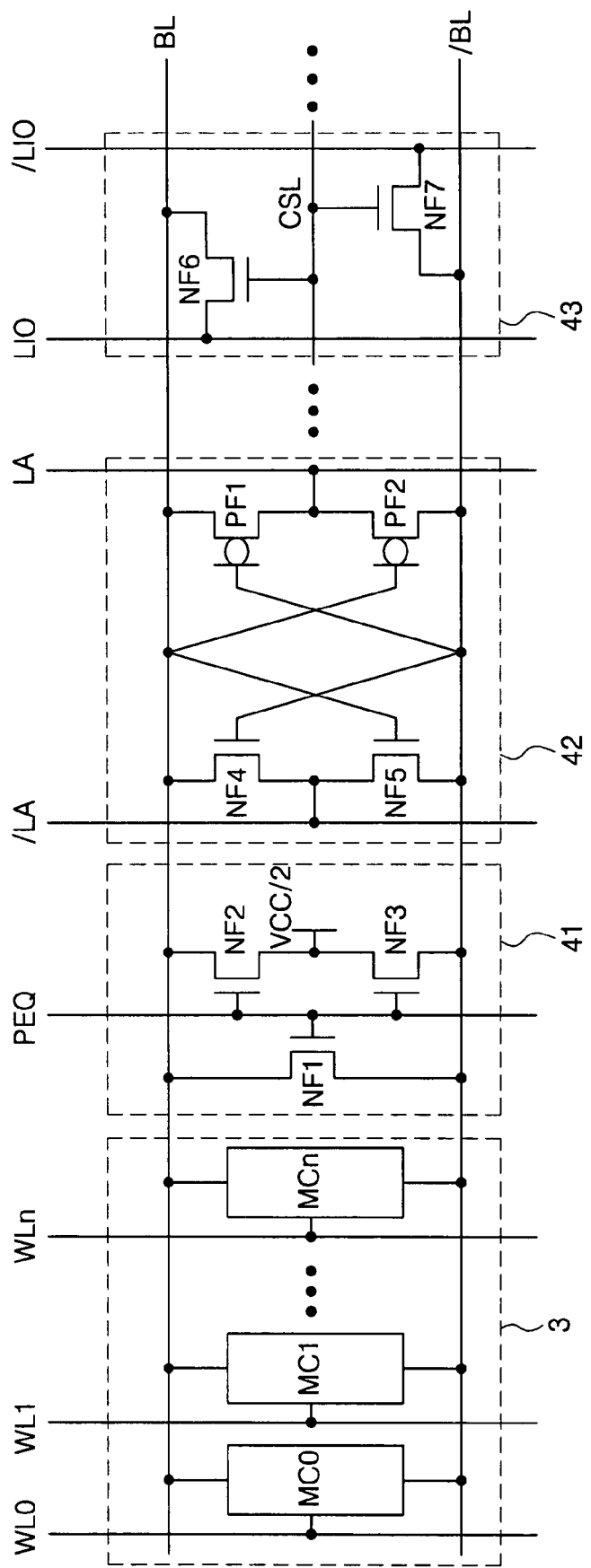
FIG. 4 is a circuit diagram illustrating a core region of a semiconductor memory device according to an example embodiment of the present invention.

FIG. 4 is a circuit diagram illustrating a core region of a semiconductor memory device according to an example embodiment of the present invention.

Referring to FIG. 4, a core region of a semiconductor device according to an example embodiment of the present invention may include a memory cell array 3, a precharge circuit 41, a bit line sense amplifier 42 and a data I/O circuit 43. The memory cell array 3 may read and/or write data in response to a signal transmitted via a word line WL and a bit line pair BL and /BL. The precharge circuit 41 may precharge the bit line pair BL and /BL to a precharge voltage level in response to a precharge control signal PEQ. The bit line sense amplifier 42 may detect and/or amplify a voltage difference of the bit line pair BL and /BL in response to a sensing control signal pair LA and /LA, and the data I/O circuit 43 may transmit data of the bit line pair BL and /BL to a local data I/O line pair LIO and /LIO or may transmit data of the local data I/O line pair LIO and /LIO to the bit line pair BL and /BL in response to a column selecting signal CSL. According to an example embodiment of the present invention, the memory cell array 3, the precharge circuit 41, the bit line sense amplifier 42 and the data I/O circuit 43 may be implemented using one or more FINFETs instead of the one or more MOSFETs used in conventional semiconductor devices.

The components of an example embodiment of the present invention illustrated in FIG. 4 are explained below.

The memory cell array 3 may include a plurality of memory cells MC each of which may include at least one n-FINFET (not shown) or p-FINFET (not shown) and a capacitor (not shown) which may be connected between the word line WL and the bit line pair BL and /BL.

The precharge circuit 41 may include first and second n-FINFETs NF1 and NF2, which may be connected directly between the bit line pair BL and /BL, may have a gate to which the precharge control signal PEQ may be applied, and may precharge the bit line pair BL and /BL to a precharge voltage VCC/2 level in response to the precharge control signal PEQ. The precharge circuit 41 may also include a third n-FINFET NF3, which may be connected between the bit line pair BL and /BL, may have a gate to which the precharge control signal PEQ may be applied, and may precharge the bit line pair BL and /BL to the precharge voltage VCC/2 level in response to the precharge control signal PEQ.

The bit line sense amplifier 42 may include a p-type sense amplifier and an n-type sense amplifier, which may be connected to the bit line pair BL and /BL, respectively. The p-type sense amplifier may be serially connected between the bit line pair BL and /BL; may include first and second n-FINFETs PF1 and PF2, which may have a gate connected to the bit line pair BL and /BL and a common source to which a sensing control signal LA may be applied; and may detect data of a low level of one of the bit line pair BL and /BL to amplify the other line of the bit line pair BL and /BL to a power voltage VCC level. The n-type sense amplifier may be serially connected between the bit line pair BL and /BL; may include fourth and fifth n-FINFETs NF4 and NF5, which may have a gate connected to the bit line pair BL and /BL and a common source to which an inverted sensing control signal /LA may be applied; and may detect data of a high level of one of the bit line pair BL and /BL to amplify the other line of the bit line pair BL and /BL to a ground voltage level, for example, 0 Volts.

The data I/O circuit 43 may include a sixth n-FINFET NF6, which may be connected between the bit line BL and the local data I/O line LIO and may have a gate to which the column selecting signal CSL may be applied, and a seventh n-FINFET NF7, which may be connected between the inverted bit line /BL and the inverted local data I/O line /LIO and may have a gate to which the column selecting signal may be applied; and may electrically connect the bit line pair BL and /BL and the local data I/O line pair LIO in response to the column selecting signal CSL.

As described above and illustrated in FIG. 4, a semiconductor memory device according to an example embodiment of the present invention may include memory cells MC0 to MCn, a precharge circuit 41, a bit line sense amplifier 42, and a data I/O circuit 43 which may be implemented by n-FINFETs and/or p-FINFETs.

Figure 5:
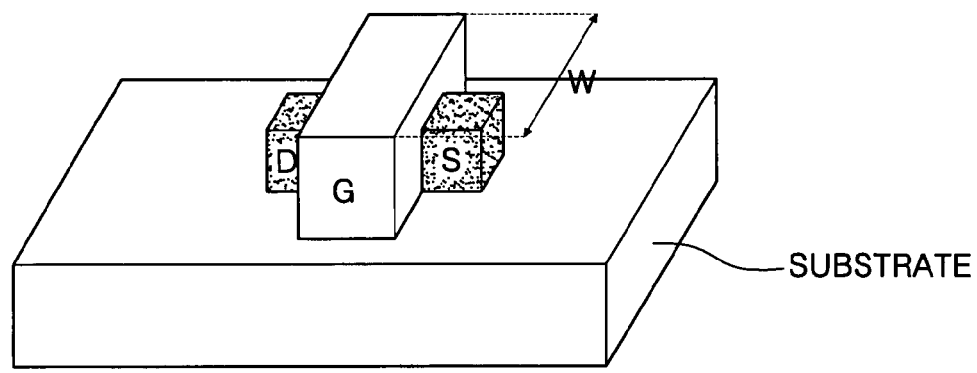
FIG. 5 is a perspective view illustrating a structure of a FINFET transistor according to an example embodiment of the present invention.

The n-FINFET and p-FINFETs of FIG. 4 may be three-dimensional transistors according to an example embodiment of the present invention. The n-FINFET may vertically extend from the substrate and may include a fin made of an insulating material. Source and drain regions S and D may be formed on ends of the fin, and a gate electrode G may be formed horizontally above the fin according to an example embodiment of the present invention as shown in FIG. 5. A FINFET according to an example embodiment of the present invention may be formed such that the source and drain regions S and D have a fin shape and the gate G is formed through the three sides of the fin, thereby reducing the layout area size of the FINFET.

Figure 3:
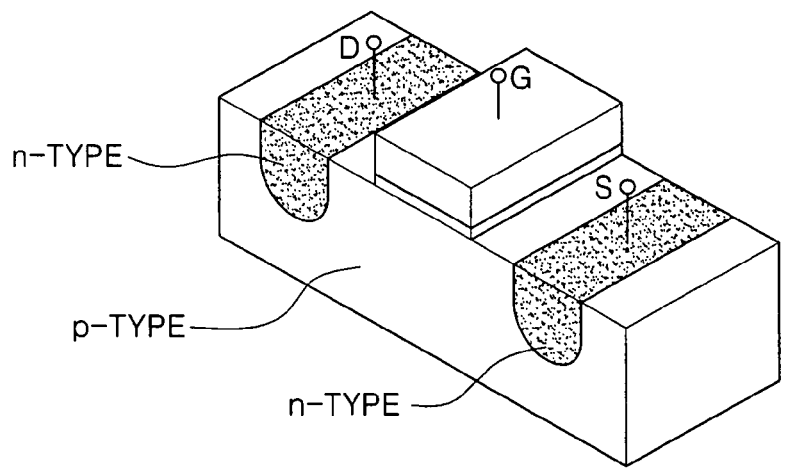
FIG. 3 is a perspective view illustrating a structure of a conventional MOSFET.

For example, the MOSFET of FIG. 3 may require a gate width of 10 μm to provide a predetermined or desired current driving force, but the FINFET of FIG. 5 may provide the same predetermined or desired current driving force with a gate width W of 9 μm.

Therefore, the FINFET of FIG. 5 may reduce the layout area size by about 10% compared to the MOSFET of FIG. 3.

According to an example embodiment of the present invention, the gate G of a FINFET may surround both sides of the fin and may form a channel on each side. The n-FINFET may efficiently control a channel through the gate G so that the n-FINFET may be activated using a low threshold voltage VTf. For example, when activated, a FINFET according to an example embodiment of the present invention may have increased driving current and a threshold voltage of about 0 Volts to about 0.2 Volts, which is about 0.5 Volts to about 0.7 Volts lower than a threshold voltage of a conventional MOSFET as shown in FIG. 3, which is about 0.7 Volts.

Figure 6:
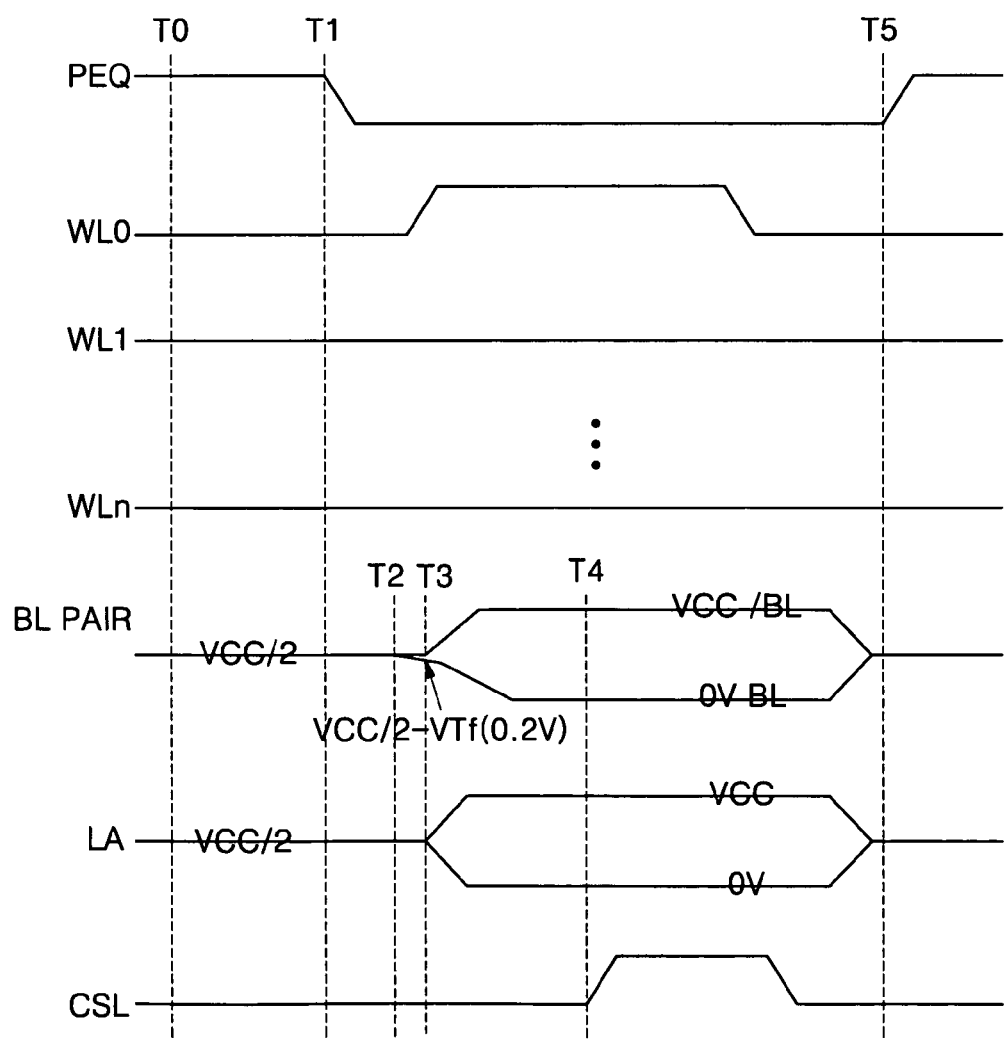
FIG. 6 is a timing diagram illustrating an operation of a semiconductor memory device according to an example embodiment of the present invention.

Referring to FIG. 6, an operation of a semiconductor memory device of FIG. 4 according to an example embodiment of the present invention is explained below.

For illustrative purposes, assume that data having a value of "0" is stored in a 0-th memory cell MC0 of the memory cell array 3 and the semiconductor memory device according to an example embodiment of the present invention reads data in the 0-th memory cell MC0 by a reading operation.

At a time T0, the semiconductor memory device according to an example embodiment of the present invention may be in a precharge state, word lines WL0 to WLN may have a low level, and the bit line precharge control signal PEQ may have a high level. The n-FINFETs NF1 to NF3 of the precharge circuit 41 may be activated to precharge the bit line pair BL and /BL to the precharge voltage VCC/2.

At a time T1, the bit line precharge control signal PEQ may transition from a high level to a low level, the 0-th word line WL0 may transition from a low level to a high level, so that the 0-th memory cell MC0 may be selected and data of the 0-th memory cell MC0 may be outputted to the bit line pair BL and /BL. As a result, a voltage of the bit line BL may gradually drop, and the inverted bit line /BL may maintain the precharge voltage VCC/2 level. If data stored in the memory cell array 3 is "1", the voltage of the bit line BL may be gradually increased.

At a time T2, a voltage of the sensing control signal LA may change from the precharge voltage VCC/2 to the power voltage VCC, and a voltage of the inverted sensing control signal /LA may change from the precharge voltage VCC/2 to the ground voltage, for example, 0 Volts, so that the power voltage VCC may be applied to the sources of the first and second p-FINFETs PF1 and PF2 of the bit line sense amplifier 42, and the ground voltage, for example, 0 Volts may be applied to drains of the fourth and fifth n-FINFETs NF4 and NF5.

At a time T3, if a voltage difference between the sensing control signal LA and the bit line BL is greater than the threshold voltage VTf of the FINFET, the second p-FINFET PF2 of the bit line sense amplifier 42 may be activated by the voltage of the bit line BL to apply the power voltage VCC to the inverted bit line /BL so that the voltage of the inverted bit line /BL may be increased. If a voltage difference between the inverted sensing control signal /LA and the inverted bit line /BL is greater than the threshold voltage VTf of the FINFET, the fourth n-FINFET NF4 may be activated by the voltage of the inverted bit line /BL to drop the voltage of the bit line BL to the ground voltage, for example, 0 Volts.

As a result, the bit line sense amplifier 42 may be activated and may start to perform an operation for amplifying the bit line pair BL and /BL.

At a time T4, if an amplification operation of the bit line pair BL is stabilized, the column selecting signal CSL may transition from a low level to a high level and data of the bit line pair BL may be transmitted to the local data I/O line pair LIO and /LIO so that data of the memory cell MC0 may be read.

At a time T5, if a read operation is completed, the 0-th word line WL0 may transition from a high level to a low level again to keep data of the 0-th memory cell MC0 in the storing state.

At a time T6, for the next read or write operation, the bit line precharge control signal PEQ may transition from a low level to a high level again to precharge the bit line pair BL and /BL to the precharge voltage VCC/2, whereby the semiconductor memory device becomes the precharge state again.

A write operation of the semiconductor memory device according to an example embodiment of the present invention is performed based on the same principle described above with respect to the read operation described in FIG. 6, and thus description of the write operation will be omitted for the sake of brevity.

As described above, in a semiconductor memory device according to an example embodiment of the present invention, a FINFET, which may have a threshold of about 0 Volts to about 3 Volts may be used to form the memory cells MC0 to MCn, the precharge circuit 41, the bit line sense amplifier 42, and the data I/O circuit 43 and may be activated or deactivated to read or write data of the memory cell in response to a plurality of control signals PEQ, LA, /LA, and CSL and a voltage level of the bit line pair BL and /BL.

As a result, the second p-FINFET PF2 of the bit line sense amplifier 42 may be activated to start the sensing operation if the voltage difference between the sensing control signal LA and the bit line BL or the voltage difference between the inverted sensing control signal /LA and the inverted bit line /BL is greater than about 0 Volts to about 0.2 Volts (e.g., the voltage difference VGS between the gate and the source of the second p-FINFET PF2 is greater than about 0 Volts to about 0.2 Volts) as illustrated at the time T2. Further, the sending operating speed of the bit line sense amplifier 42 may increase based on the operation characteristics of the FINFET, which may provide increased driving current when activated.

Accordingly, the bit line sense amplifier 42 of an example embodiment of the present invention may start to perform the sensing operation in response to a voltage difference which is about 0.5 Volts to about 0.7 Volts lower than conventional sense amplifier and the sensing operating speed of the bit line sense amplifier according to an example embodiment of the present invention may increase. According to an example embodiment of the present invention, general operation characteristics of the bit line sense amplifier may be improved.

Based on similar reasoning, according to an example embodiment of the present invention, the memory cells MC0 to MCn, the precharge circuit 41, and the data I/O circuit 43 may perform operations in response to a voltage difference which is lower than those of conventional art devices including MOSFETS.

As described above, in a semiconductor memory device according to an example embodiment of the present invention, the circuits in the core region are implemented by using the FINFETs, which have the smaller layout area size and a lower threshold voltage than the MOSFETs. Accordingly, the layout area size of a semiconductor memory device according to an example embodiment of the present invention is significantly reduced and the operating speed, e.g., the sensing operating speed of the bit line sense amplifier may be increased.

What is claimed is:

1. A semiconductor memory device, comprising:
a memory cell array including a plurality of memory cells, each memory cell connected between a bit line pair and inputting or outputting data through the bit line pair; and
at least one bit line sense amplifier which is connected between the bit line pair and detects a voltage difference of the bit line pair to amplify a level of the bit line pair, wherein the at least one bit line sense amplifier includes a plurality of transistors which have a smaller layout area size and a lower threshold voltage than a MOSFET.

2. The device of claim 1, wherein the bit line pair includes a bit line and an inverted bit line, and each of the plurality of memory are serially connected between the bit line and the inverted bit line.

3. The device of claim 2, wherein the at least one bit line sense amplifier detects a voltage difference between the bit line and the inverted bit line.

4. The device of claim 1, wherein at least one of the memory cell array and the at least one bit line sense amplifier includes at least one FINFET.

5. The device of claim 4, wherein a threshold voltage of the at least one FINFET is within a range of about 0 Volts to about 0.2 Volts.

6. The device of claim 1, wherein the at least one bit line sense amplifier includes
a p-type sense amplifier having a first p-FINFET and a second p-FINFET, which are connected in series between the bit line pair, and detect a low level of one of the bit line pair to amplify the other line of the bit line pair to a first voltage level; and
an n-type sense amplifier having a first n-FINFET and a second n-FINFET, which are connected in series between the bit line pair, and detect a high level of one of the bit line pair to amplify the other line of the bit line pair to a second voltage level.

7. The device of claim 6, wherein the first voltage is a power voltage, and the second voltage is a ground voltage.

8. The device of claim 1, wherein each of the plurality of memory cells includes at least one FINFET and a capacitor.

9. A semiconductor memory device, comprising:
a memory cell array including a plurality of memory cells, each memory cell connected between a bit line pair and inputting or outputting data to through the bit line pair;
a precharge circuit for precharging the bit line pair to a precharge voltage level during a precharge period; and
at least one bit line sense amplifier which is connected between the bit line pair and detects a voltage difference of the bit line pair to amplify a level of the bit line pair, wherein the at least one bit line sense amplifier includes at least one FINFET.

10. The device of claim 9, wherein the bit line pair includes a bit line and an inverted bit line, and each of the plurality of memory are serially connected between the bit line and the inverted bit line.

11. The device of claim 10, wherein the at least one bit line sense amplifier detects a voltage difference between the bit line and the inverted bit line.

12. The device of claim 9, wherein at least one of the memory cell array and the precharge circuit includes at least one FINFET.

13. The device of claim 12, wherein a threshold voltage of the at least one FINFET is within a range of about 0 Volts to about 0.2 Volts.

14. The device of claim 9, wherein the precharge circuit includes
a first and a second FINFET which are connected between the bit line pair and precharge the bit line pair in response to a precharge control signal; and
a third FINFET which is connected between the bit line pair and causes voltage levels of the bit line pair to match in response to the precharge control signal.

15. The device of claim 9, wherein the at least one bit line sense amplifier includes
a p-type sense amplifier having a first p-FINFET and a second p-FINFET, which are connected in series between the bit line pair, and detects a low level of one of the bit line pair to amplify the other line of the bit line pair to a first voltage level; and an n-type sense amplifier having a first n-FINFET and second n-FINFET, which are connected in series between the bit line pair, and detects a high level of one of the bit line pair to amplify the other line of the bit line pair to a second voltage level.

16. The device of claim 15, wherein the first voltage is a power voltage, and the second voltage is a ground voltage.

17. The device of claim 16, wherein each of the plurality of memory cells includes at least one FINFET and a capacitor.

18. The device of claim 9, further comprising:

a data I/O line selecting portion for controlling connection between the bit line pair and the data I/O line pair, the data I/O selecting portion including a plurality of FINFETs.

19. The device of claim 18, wherein the data I/O line selecting portion includes a fourth FINFET which is connected between the bit line and a data I/O line and transfers data of the bit line to the data I/O line in response to a column selecting signal; and a fifth FINFET which is connected between an inverted bit line and an inverted data I/O line and transfers data of the inverted bit line to the inverted data I/O line in response to the column selecting signal.

* * * * *